US005357575A

United States Patent [19]

Kitamura

[11] Patent Number: 5,357,575

[45] Date of Patent: Oct. 18, 1994

[54] SOUND PROCESSING SYSTEM

[75] Inventor: Mineo Kitamura, Hamamatsu, Japan

[73] Assignee: Kabushiki Kaisha Kawai Gakki Seisakusho, Japan

[21] Appl. No.: 11,483

[22] Filed: Jan. 26, 1993

[30] Foreign Application Priority Data

Mar. 30, 1992 [JP] Japan .................................. 4-074566

[51] Int. Cl.$^5$ .................................................. H03G 3/00

[52] U.S. Cl. .......................................... 381/61; 84/604; 84/622; 84/625; 84/660; 84/697

[58] Field of Search .................. 84/604, 622, 625, 660, 84/697; 381/61, 98

[56] References Cited

U.S. PATENT DOCUMENTS 4,939,973 7/1990 Suzuki .................................. 84/625

5,133,014 7/1992 Pritchard .............................. 381/61

OTHER PUBLICATIONS

Chamberlin, Musical Applications of Microprocessors, 1980, pp. 464–465.

*Primary Examiner*—Forester W. Isen

*Attorney, Agent, or Firm*—Davis, Bujold & Streck

[57] ABSTRACT

A sound processing system comprises a waveform distributor for distributing an input sound waveform, offset devices for executing an offset process for each of the waveforms received from the waveform distribution device, and a multiplication and addition device for multiplying the offset waveforms by predetermined coefficients and then adding the multiplied waveforms. Since the distributed waveforms are offset by the independent offset devices, highly varied sound can be produced by changing the coefficients of the offset devices and the multiplication and addition device, and also by changing these coefficients as time elapses.

13 Claims, 9 Drawing Sheets

PRIOR ART

SOUND PROCESSING SYSTEM

BACKGROUND OF THE INVENTION

This invention relates to a sound processing system for processing a sound waveform received from a sound source.

A conventional sound processing system processes an input sound waveform employing, for example, a digital signal processor. FIG. 7 illustrates a typical digital signal processor 141 which includes a multiplier 141*a*, an adder 141*b*, and two buffers 141*c* and 141*d*. The digital signal processor 141 processes a received digital signal and outputs the digital signal processed in a desired manner. The process of the digital signal processor 141 proceeds rapidly utilizing a pipelining process, in which the execution of a command and the fetch of the next command occur synchronously and generally simultaneously.

An example of such a digital signal processor employed for processing sound waveforms is illustrated in FIG. 8 wherein it is generally indicated as 151. The digital signal processor 151 includes a memory 157*a*, a multiplier 153, an offset circuit 155, and a memory 157*d*. The offset circuit 155 is provided with multipliers 159, 161, 163, 165 and 167, and adders 169, 171 and 173, The exemplary offset circuit 155 thus executes an offset process for an input sound waveform, establishing the multiplication coefficients of the six multipliers 153, 159, 161, 163, 165 and 167 appropriately.

FIG. 9 shows an example of the offset process performed by the offset circuit 155, showing waveforms obtained at each process step. A triangular waveform A is input, and is shifted upward in a predetermined range by operating the multipliers 153, 159 and the adder 169. The waveform A thus overflows in a dynamic range L, obtaining a waveform B. The waveform B is then shifted downward in a predetermined range employing the multipliers 161, 163 and the adder 171, resulting in a waveform C. Finally, the waveform C is shifted upward in a predetermined range by the multipliers 165, 167 and the adder 173. The resulting final waveform is shown as a waveform D. The process for obtaining the waveform D from the waveform A is defined as the offset process hereinafter.

The prior art sound processing system, however, can perform only limited patterns of the offset process for an input sound waveform since the combination of the multiplication coefficients of the multipliers is limited. Thus, in the conventional system the final waveform is produced by only a limited process, such as simple linear signal processing.

SUMMARY OF THE INVENTION

Wherefore, an objective of the present invention is to provide a sound processing system that can perform various processes including non-linear processing for an input sound waveform. The system of the present invention can produce highly varied sound by these processes.

It has been now found that the foregoing and related objects of the invention are readily attained by the provision of a sound processing system as illustrated in FIG. 1, including: waveform distribution means for distributing an input sound waveform as a plurality of distributed input waveform signals; a corresponding plurality of offset means, each offset means executing an offset process for each of the waveforms received from the distribution means; and multiplication and addition means for multiplying the offset waveforms by predetermined coefficients and then adding the multiplied waveforms.

The sound processing system of the present invention thus constructed processes an input sound waveform by the following steps. First, the waveform distribution means distributes an input sound waveform to each of the offset means. Since a sound waveform changes in voltage with the lapse of time, a plurality of waveforms identical to each other with respect to the change in voltage can be obtained by simply distributing the input waveform at the point of the waveform distribution means. Each of the distributed waveforms is offset by the offset means. The offset waveforms are multiplied by the predetermined coefficients, and the multiplied waveforms are added by the multiplication and addition means. Since the distributed waveforms are offset by the independent offset means before they are added, varied sound can be produced by changing the combination of the coefficients of the offset means and the multiplication and addition means, and also by changing these coefficients as times elapses.

DETAILED DESCRIPTION OF THE PREFERRED EMBODIMENT

Before beginning the description of the present invention and its preferred embodiment, it should be pointed out that the following description is directed to a sound effect generator which includes a sound processing system of the invention. As those skilled in the art will readily recognize and appreciate, the scope and spirit of the invention is much larger than that limited application.

Figure 1:
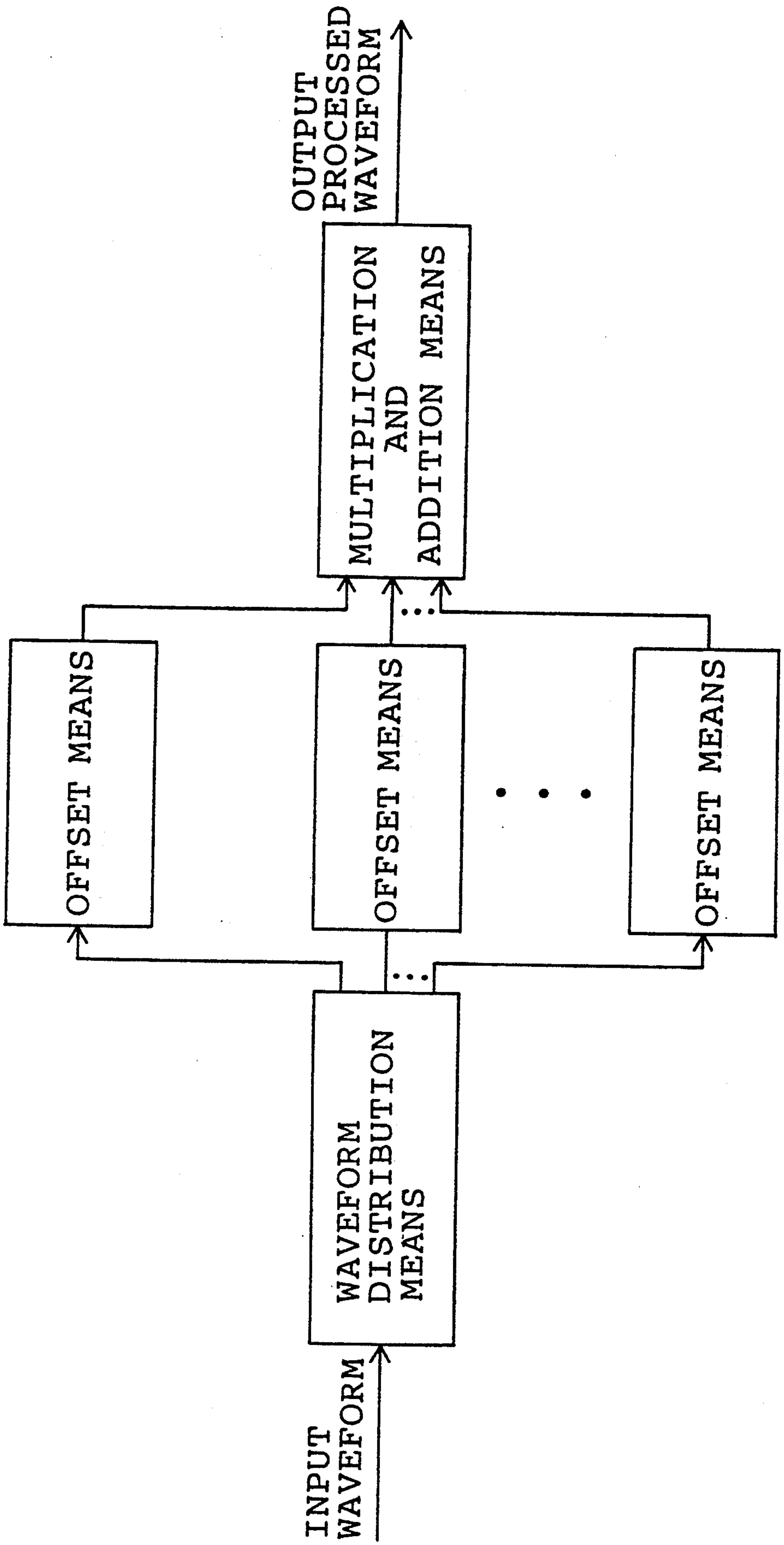
FIG. 1 is an explanatory block diagram showing the main structure of a sound processing system according to the present invention.
Figure 2:
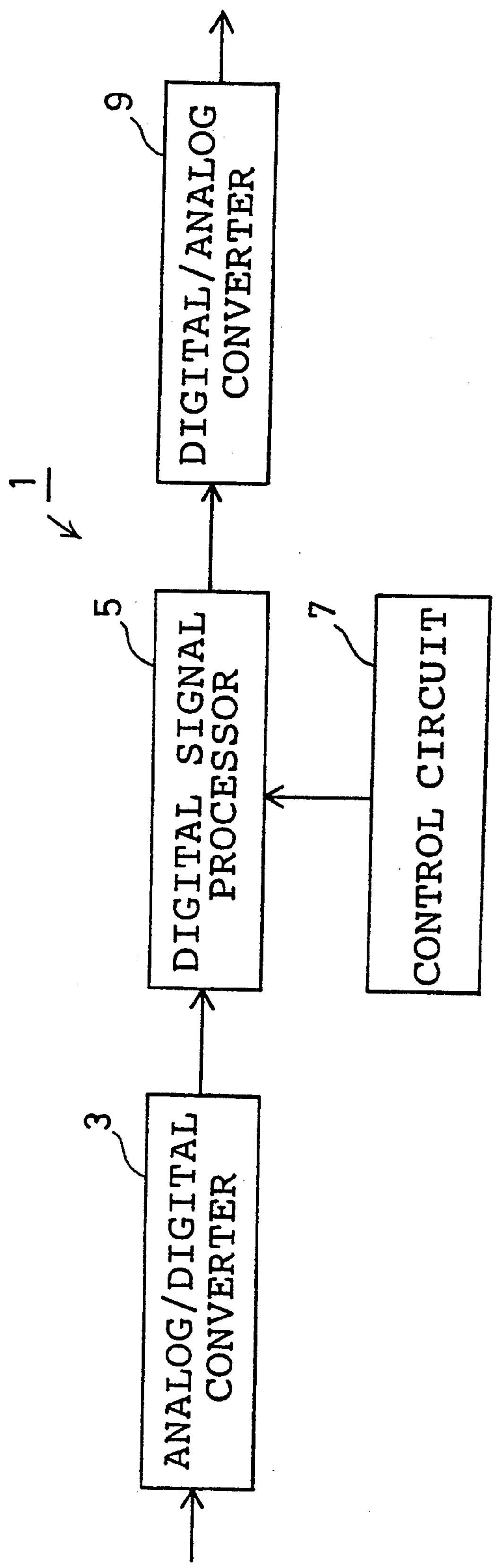
FIG. 2 shows the main structure of a sound processing system embodying the present invention.

Referring to FIG. 2, a sound effect generator 1 includes, as a main process unit for processing an input sound waveform, an analog/digital converter 3, a digital signal processor 5, a control circuit 7, and a digital/analog converter 9.

The analog/digital converter 3 receives a sound waveform from a sound source and converts analog signals of the waveform into digital signals.

The digital signal processor 5 executes a predetermined process on the digital signals of the waveform entering from the analog/digital converter 3, and outputs the digital signals of the processed waveform. The operation of the digital signal processor 5 proceeds with a pipelining process, in which the execution of a command and the fetch of the next command occur synchronously and generally simultaneously.

The control circuit 7, which is provided with a CPU and associated circuitry, controls the operation of the digital signal processor 5 in a manner described below. The digital/analog converter 9 converts digital signals of the waveform processed by the digital signal processor 5 into analog signals.

Figure 3:
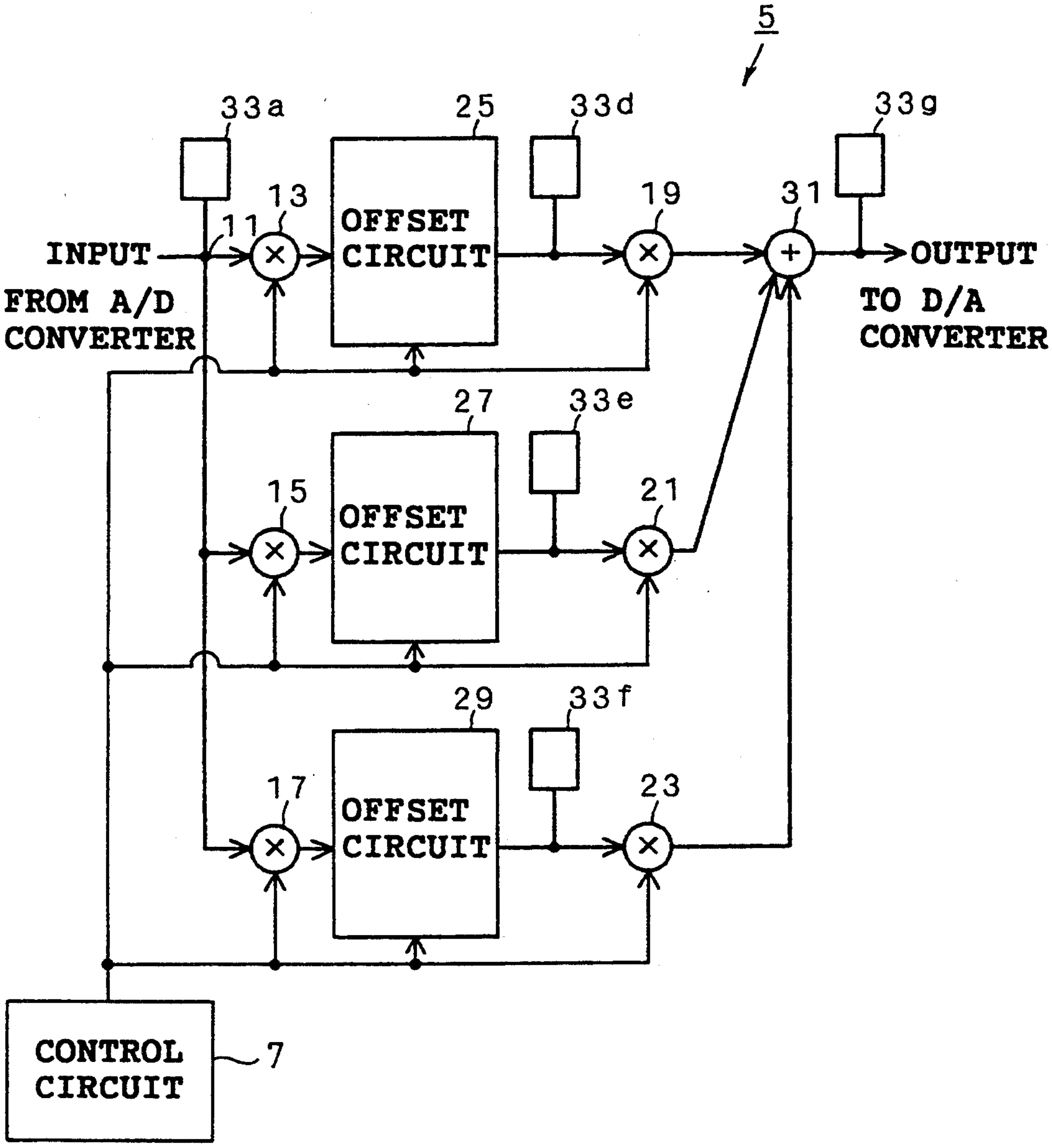
FIG. 3 shows the components of the digital signal processor employed for processing an input sound waveform.

FIG. 3 shows the components of the digital signal processor 5 employed for processing an input sound waveform. As illustrated in FIG. 3, the digital signal processor 5 includes a waveform distribution point 11, six multipliers 13, 15, 17, 19, 21 and 23, three offset circuits 25, 27 and 29, an adder 31, and five memories or memory buffers 33*a*, 33*d*, 33*e*, 33*f* and 33*g*. The control circuit 7 determines the multiplication coefficients of the multipliers 13, 15, 17, 19, 21 and 23, and the offset circuits 25, 27 and 29.

The waveform distribution point 11, functioning as waveform distribution means, distribution an input sound waveform to each of the offset circuits 25, 27 and 29. Since a sound waveform changes in voltage with the lapse of time, a plurality of waveforms identical to each other with respect to the change in voltage can be obtained by simply distributing the input waveform at the waveform distribution point 11.

The multipliers 13, 15, 17, 19, 21 and 23 individually multiply each respective divided waveforms by a pre-established multiplication coefficients, and output resultant waveforms. While the multiplication coefficients of the multipliers 13, 15, 17, 19, 21 and 23 are pre-determined in this embodiment, these coefficients can be changed with the lapse of time by employing time series digital data. Such time series digital data may be digital waveforms input from outside, or waveforms within the sound effect generator 1. Alternatively, such digital data can be obtained by adding the digital waveforms outside and the waveforms inside multiplied by a predetermined coefficient, or by multiplying or dividing those waveforms by a predetermined coefficient. Supposing each of the coefficients of the multipliers 13, 15, 17, 19, 21 and 23 is $\alpha$, $\alpha$ may be more than 1. Otherwise, the multipliers 13, 15, 17, 19, 21 and 23 can be used as dividers by setting $\alpha$ in the range of $0<\alpha<1$, or as subtractors by establishing $\alpha$ less than 0. The coefficients of the multipliers 13, 15, 17, 19, 21 and 23 can be set differently from each other.

Figure 8:
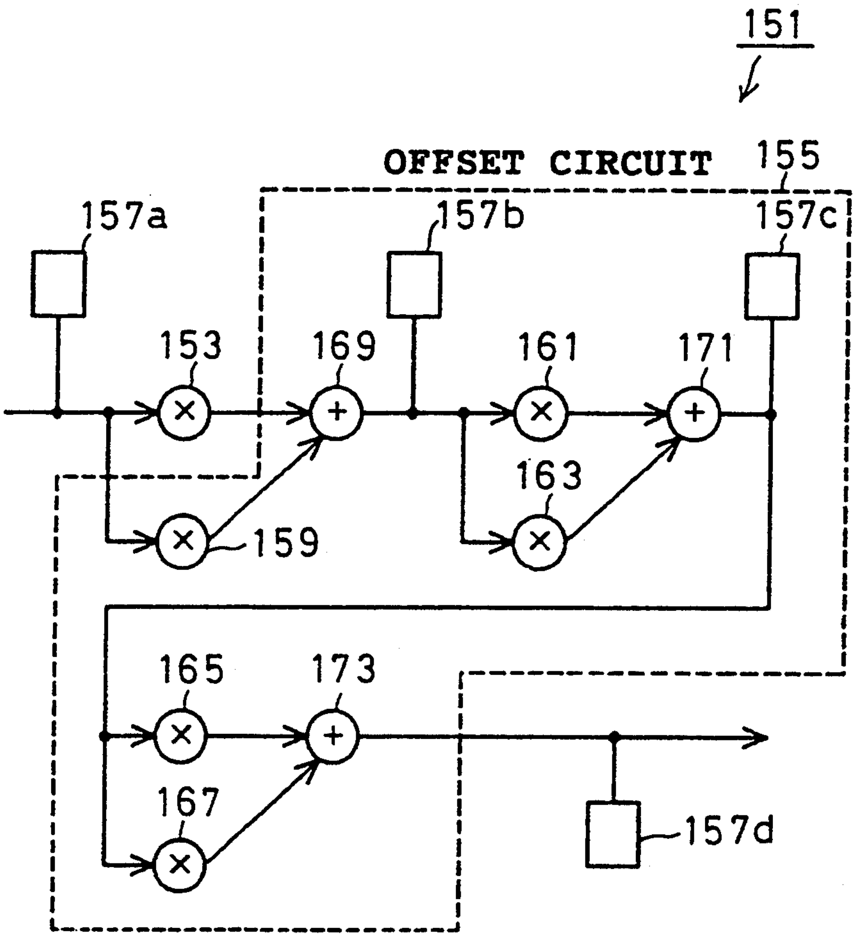
PRIOR ART FIG. 8
FIG. 8 shows the components of a prior-art digital signal processor employed in a conventional sound processing system for processing an input sound waveform.
Figure 9A:
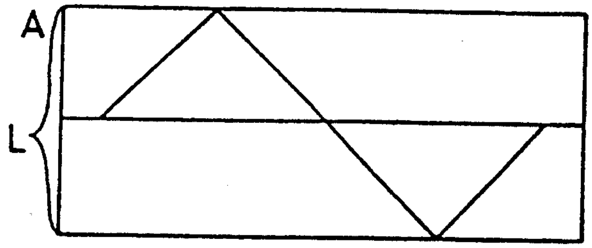
FIGS. 9A–9D show the sound waveforms obtained at each process step in the conventional sound processing system.
Figure 9B:
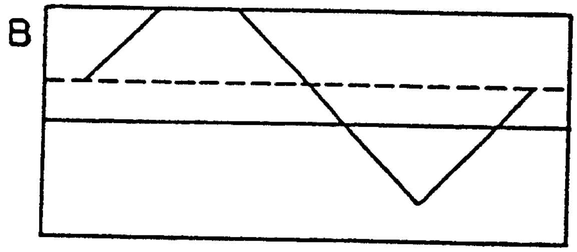
PRIOR ART FIG. 9B
Figure 9C:
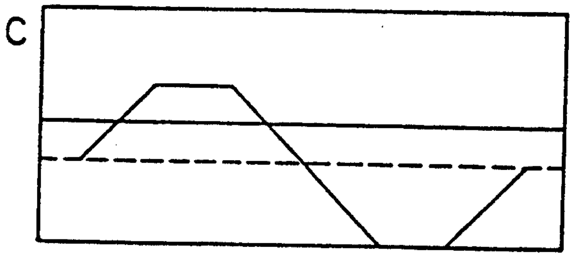
PRIOR ART FIG. 9C
Figure 9D:
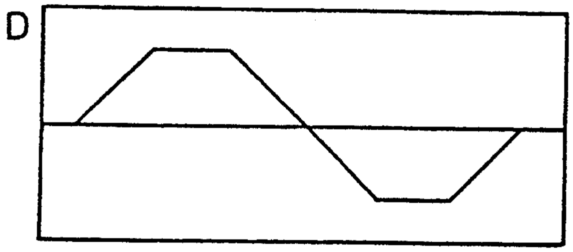
PRIOR ART FIG. 9D

The offset circuits 25, 27 and 29 are logical circuits each of which has a construction similar to that of the prior art offset circuit 155. In the same manner as in the offset circuit 155, the offset circuits 25, 27 and 29 perform an offset process for an input waveform, such as the triangular waveform A in FIG. 8, thereby obtaining the final waveform D.

The adder 31 adds each of the waveforms multiplied by the multipliers 19, 21, and 23. The multipliers 19, 21 and 23 and the adder 31 function as multiplication and addition means.

The memories 33*a*, 33*d*, 33*e*, 33*f* and 33*g* store each waveforms obtained at their respective positions.

The process steps executed by the control circuit 7 for controlling the operation of the digital signal processor 5 will now be described with reference to the flow charts in FIGS. 4A and 4B. A waveform to be processed is stored in the memory 33*a* before the process starts. In the present embodiment, a triangular waveform A in FIG. 5 will be processed by the digital signal processor 5.

Figure 4A:
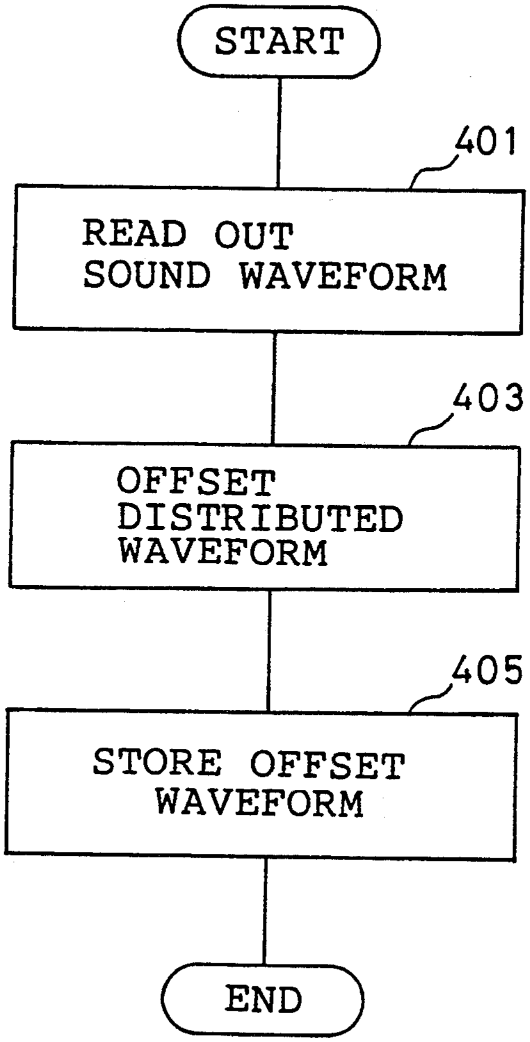
FIGS. 4A and 4B are flowcharts showing the steps for controlling the digital signal processor by a control circuit of the present embodiment.
Figure 4B:
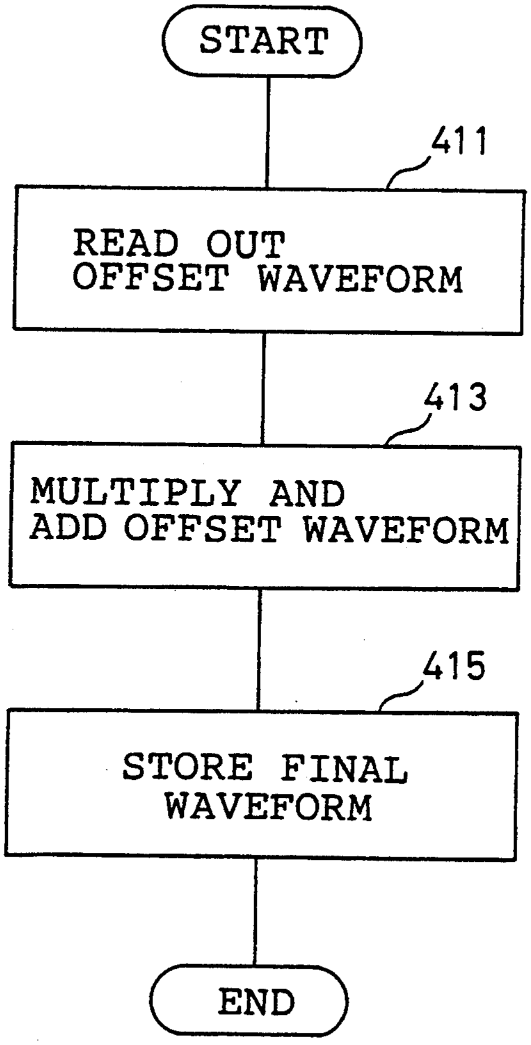
Figure 5A:
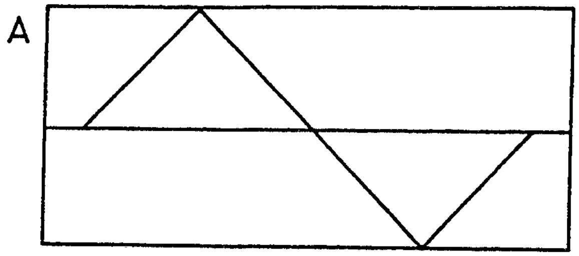
FIGS. 5A–5E show the sound waveforms obtained at each process step in the disclosed embodiment.
Figure 5B:
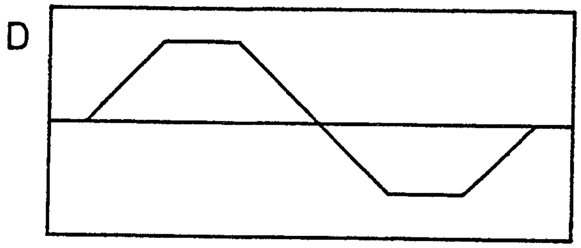
Figure 5C:
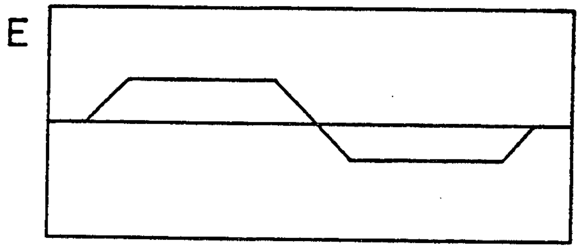
Figure 5D:
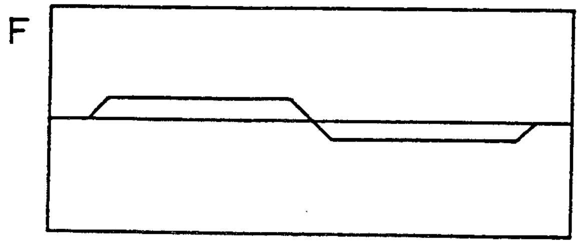
Figure 5E:
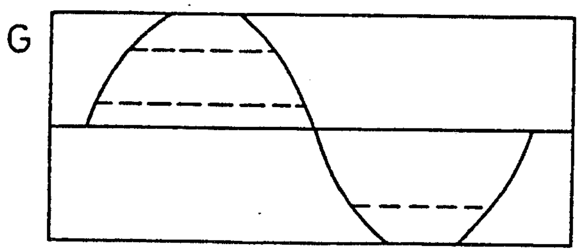

FIG. 4A shows a distribution and offset for an input sound waveform. To start this process, the operator establishes each multiplication coefficient of the multipliers 13, 15, 17 and the offset circuits 25, 27 and 29.

First, the triangular waveform A in FIG. 5 as an input waveform is read out from the memory 33*a* (step 401). Then, the offset circuits 25, 27 and 29 process respective waveforms received from the waveform distribution point 11, thereby obtaining waveforms D, E, and F shown in FIG. 5, respectively (step 403). The offset process at step 403 proceeds in the same manner as in the offset circuit 105. The resultant waveforms at step 403 are not limited to those shown in FIG. 5, but can be variable according to the combination of the multiplication coefficients of the offset circuits 25, 27 and 29. Finally, the waveforms D, E and F are stored in the memories 33*d*, 33*e* and 33*f*, respectively (step 405).

Next, a multiplication and addition process for the waveforms D, E and F will be described with reference to the flowchart in FIG. 4B. The multiplication coefficients of the multipliers 19, 21 and 23 are determined before the process of FIG. 4B starts.

First, the waveforms D, E and F are read out from the memories 33*d*, 33*e* and 33*f*, respectively (step 411). Then, the waveforms D, E and F are multiplied by the coefficient of each of the multipliers 19, 21 and 23, and all of the multiplied waveforms are added by the adder 31 (step 413). A final waveform G is provided, and is variable according to the established coefficients of the multipliers 19, 21 and 23.

An input waveform is not necessarily triangular, but may be a plurality of waveforms. If such plural sound waveforms are processed, the input waveforms are directly offset by the offset circuits 25, 27 and 29 without being distributed at the waveform distribution point 11.

As aforementioned, according to the sound effect generator 1 of the present embodiment, an input waveform is distributed to each of the offset circuits 25, 27 and 29, which individually, and in parallel, offset the waveforms based on each multiplication coefficient. The waveforms are then multiplied by the multipliers 19, 21 and 23, and the multiplied waveforms are added by the adder 31. Therefore, sound full of variety is obtainable by controlling the coefficients of the offset circuits 25, 27 and 29 and the multipliers 19, 21 and 23.

Additionally, since the sound effect generator 1 does not require a conditional branch process which is necessary for processing complicated sound waveforms by a prior art sound processing system, the pipelining process in the digital signal processor 5 of the present invention proceeds without great delay.

The present invention may be subject to many modifications and changes without departing from the spirit or essential characteristics thereof. For example, an input waveform can be distributed to a desired number of the offset circuits 25, 27 and 29 at the waveform distribution point 11. The multiplication coefficients of the offset circuits 25, 27 and 29 can be arranged such that the offset waveforms change in voltage differently from each other. The addition of such different waveforms enables non-linear signal processing, which cannot be performed by a prior art sound processing system.

Furthermore, in the sound effect generator 1, various processes other than the aforementioned embodiment are possible. For example, the coefficients of the multipliers 13, 15, 17, 19, 21 and 23 can be changed as time elapses. The offset circuits 25, 27 and 29 can be connected in series.

Figure 6:
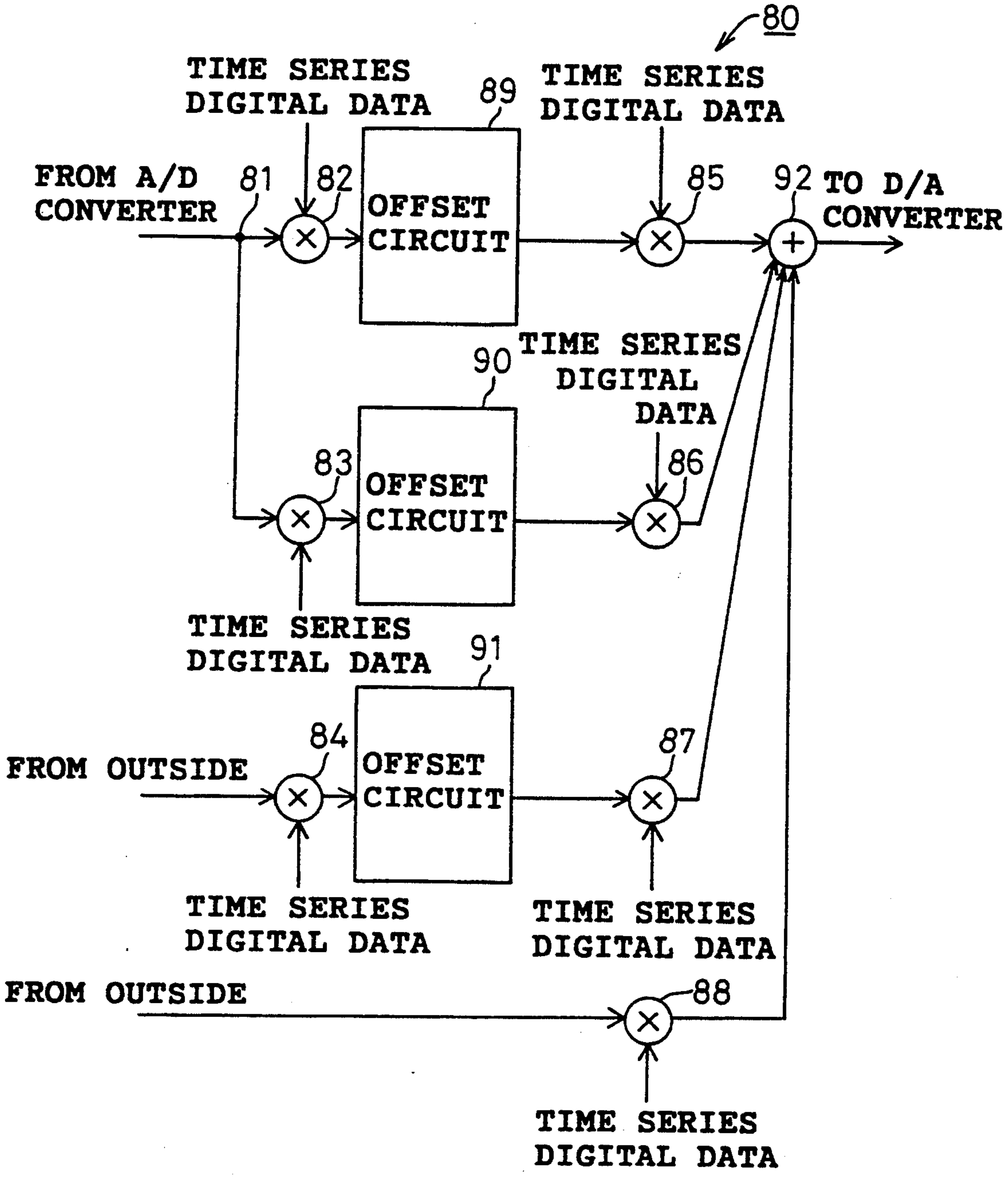
FIG. 6 depicts a modified sound processing system according to the present invention to which several digital waveforms are input from outside.
Figure 7:
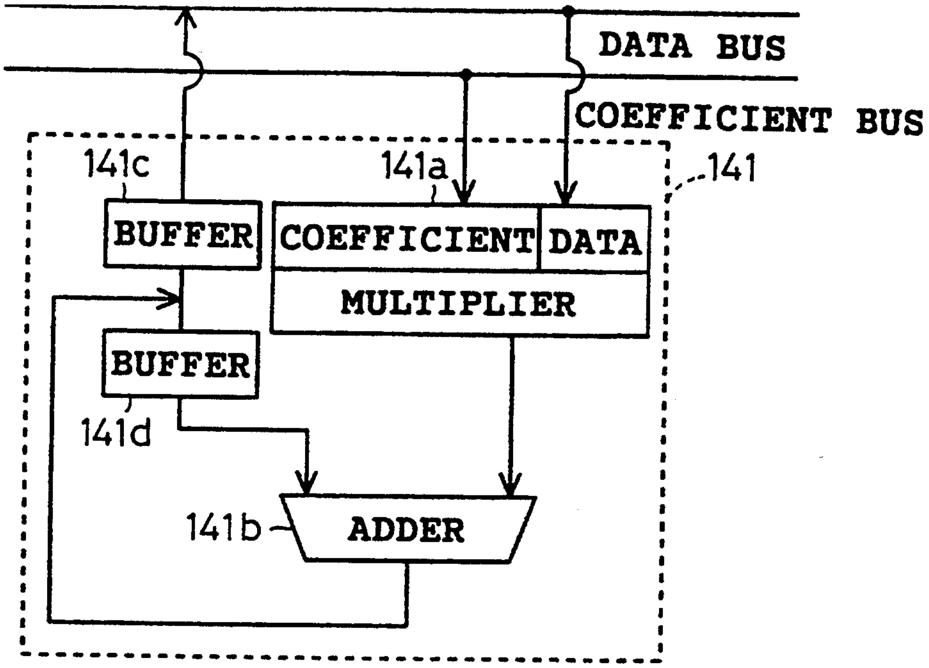
PRIOR ART FIG. 7
FIG. 7 shows the main structure of a typical prior-art digital signal processor.

Moreover, additional waveforms can be employed for executing more complicated processes. FIG. 6 shows a modified digital signal processor 80 according to the present invention. The digital signal processor 80 includes a sound distribution point 81, seven multipliers 82, 83, 84, 85, 86, 87 and 88, three offset circuits 89, 90 and 91, and an adder 92.

As shown in FIG. 6, the offset circuit 91 receives only a digital waveform from outside without receiving a waveform from the distribution point 81 as the other offset circuits 89 and 90. The adder 92 adds another digital waveform from outside as well as the offset waveforms from the offset circuits 89, 90 and 91. Thus, the provision of those additional digital waveforms enables a more complicated processing. Also, if the digital waveforms are time series digital data, the coefficients of the multipliers 82, 83, 84, 85, 86, 87 and 88 can be changed with the lapse of time.

The time series digital data employed as the multiplier coefficients may be a triangular wave, a sine wave, or the combination of these waves all input from outside. If the waveforms within the sound effect generator 1 are desired to use as the time series digital data, the waveform at the distribution point 81, and the waveforms offset by the offset circuits 89, 90 and 91 can be employed. Alternatively, the time series digital data can be obtained by adding the waveforms from outside and waveforms inside multiplied by a predetermined coefficient. If the waveform thus obtained changes in voltage more than desired, the waveform may be divided by about 10.

What is claimed is:

1. A sound processing system, for processing an input waveform, comprising:

waveform distribution means for distributing an input sound waveform to a plurality of offset means;

a plurality of offset means, each offset means coupled to said waveform distribution means for receiving distributed input sound waveform to be processed and for executing, in parallel with all other said offset means, an offset process on each received distributed input sound waveform, each of said plurality of offset means providing an offset sound waveform;

at least a first plurality of multiplication means, each of said first plurality of multiplication means coupled to a corresponding one of said plurality of offset means, for multiplying a received offset sound waveform by a coefficient, and for providing a multiplied offset waveform;

one addition means, coupled to each of said first plurality of said multiplication means, for summing each of said multiplied offset waveforms and for providing one, summed processed waveform; and a second plurality of multiplication means, coupled between said waveform distribution means and said plurality of offset means, each of said second plurality of multiplication means operative for multiplying a received, distributed, input sound waveform by a coefficient, each of said second plurality of multiplication means providing a multiplied, distributed, sound waveform to a corresponding one of said plurality of offset means.

2. The system of claim 1 wherein said respective first and second plurality of multiplication means perform said multiplying in parallel with all other respective first and second plurality of multiplication means.

3. The system of claim 1 further including one processed sound waveform storage means, coupled to said one addition means, for storing said one summed, processed sound waveform.

4. The system of claim 1 wherein time series digital data is input as a coefficient or coefficients of said first and/or second single or plurality of multiplication means, whereby changing said coefficient or coefficients with the lapse of time.

5. The system of claim 4 wherein said time series digital data is digital waveforms input from outside or waveforms within the system, or is obtained by adding the digital waveforms from outside and the waveforms within the system multiplied by a coefficient, or by multiplying or dividing the digital waveforms from outside and the waveforms within the system by a coefficient.

6. The system of claim 1 wherein, supposing said coefficient or coefficients of said first and/or second single or plurality of multiplication means as $\alpha$, $\alpha$ is/are set in the range of $0<\alpha<1$, whereby employing said first and/or second multiplication means as a divider or dividers.

7. The system of claim 1 wherein, supposing the coefficient or coefficients of said first and/or second single or plurality of multiplication means as $\alpha$, $\alpha$ is/are set less than 0, whereby employing said first and/or second multiplication means as a subtractor or subtractors.

8. The system of claim 1 wherein said plurality of offset means receive a digital waveform from outside as well as the waveforms distributed from said waveform distribution means.

9. The system of claim 1 wherein said addition means receives a digital waveform from outside as well as the waveforms offset by said offset means.

10. The system of claim 1 further including control means, coupled to some of said first and second plurality of multiplication means and to some of said plurality of offset means, for synchronizing and controlling the processing of an input sound waveform by said respective first and second plurality of multiplication means and said plurality of offset means.

11. The system of claim 10 wherein said control means is operative for changing the multiplication coefficients of each of said first and second plurality of multiplication means and said offset means multiplication means.

12. A method for processing an input sound waveform, comprising the steps of:

distributing an input sound waveform to a plurality of offset means;

multiplying each received distributed sound waveform by a coefficient, and providing multiplied, distributed, sound waveforms to each of said offset means;

executing with each of said plurality of offset means, in parallel with all other offset means, an offset process on each received, distributed, input sound waveform, and providing a plurality of offset sound waveforms;

multiplying each of said offset sound waveforms provided by each of said plurality of offset means, by a coefficient, and providing a plurality of multiplied, offset, sound waveforms; and adding and summing each multiplied, offset, sound waveform and providing one summed, processed, sound waveform.

13. The method of claim 12, including the additional step of storing said one summed, processed, sound waveform in a memory storage means.

* * * * *